US012001810B2

(12) United States Patent
Matsumoto et al.

(10) Patent No.: US 12,001,810 B2
(45) Date of Patent: Jun. 4, 2024

(54) SIGNAL PROCESSING CIRCUIT, SIGNAL PROCESSING DEVICE, AND SIGNAL PROCESSING METHOD TO SUPPRESS POWER CONSUMPTION

(71) Applicant: SONY CORPORATION, Tokyo (JP)

(72) Inventors: Tomohiro Matsumoto, Kanagawa (JP); Yusuke Oike, Kanagawa (JP); Akito Sekiya, Kanagawa (JP); Hiroyuki Yamagishi, Kanagawa (JP); Ryoji Ikegaya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 604 days.

(21) Appl. No.: 17/250,314

(22) PCT Filed: Jul. 10, 2019

(86) PCT No.: PCT/JP2019/027339
§ 371 (c)(1),
(2) Date: Dec. 31, 2020

(87) PCT Pub. No.: WO2020/013226
PCT Pub. Date: Jan. 16, 2020

(65) Prior Publication Data
US 2021/0286591 A1   Sep. 16, 2021

(30) Foreign Application Priority Data
Jul. 11, 2018 (JP) .................. 2018-131664

(51) Int. Cl.
*G06F 7/544* (2006.01)
*G06N 3/063* (2023.01)
(Continued)

(52) U.S. Cl.
CPC ............. *G06F 7/5443* (2013.01); *H03K 5/26* (2013.01); *G06N 3/063* (2013.01); *H02J 7/345* (2013.01); *H03K 19/21* (2013.01)

(58) Field of Classification Search
CPC .................. G06F 7/5443; H03K 5/26
See application file for complete search history.

(56) References Cited

U.S. PATENT DOCUMENTS 6,748,410 B1 * 6/2004 Gressel ................... G06F 7/728
                                                          708/491
2019/0130245 A1    5/2019 Sakaguchi
2019/0205780 A1    7/2019 Sakaguchi

FOREIGN PATENT DOCUMENTS

CN         101026686 A      8/2007
CN         109074516 A      12/2018
(Continued)

OTHER PUBLICATIONS

International Search Report and Written Opinion of PCT Application No. PCT/JP2019/027339, dated Oct. 1, 2019, 08 pages of ISRWO.

*Primary Examiner* — Michael D. Yaary
(74) *Attorney, Agent, or Firm* — CHIP LAW GROUP

(57) ABSTRACT

A signal processing circuit has a plurality of first circuits each including a first-time-length-signal output circuit that outputs a first time-length signal representing a time length between first timing at which a first input signal changes and second timing at which a second input signal changes and a second-time-length-signal output circuit that outputs the first time-length signal as a second time-length signal at timing based on a control signal. The signal processing circuit includes a second circuit that outputs the second time-length signal having the longest time length among a plurality of the second time-length signals output respectively from the plurality of first circuits.

15 Claims, 12 Drawing Sheets

(51) Int. Cl.
*H02J 7/34* (2006.01)
*H03K 5/26* (2006.01)
*H03K 19/21* (2006.01)

(56) References Cited

FOREIGN PATENT DOCUMENTS

| | | |
|---|---|---|
| CN | 109844738 A | 6/2019 |
| CN | 112424786 A | 2/2021 |
| JP | 2014-017575 A | 1/2014 |
| JP | 2017-211735 A | 11/2017 |
| JP | 2018-067154 A | 4/2018 |
| WO | 2017/203975 A1 | 11/2017 |
| WO | 2018/034163 A1 | 2/2018 |
| WO | 2018/074012 A1 | 4/2018 |

* cited by examiner

FIG.7

| INPUT TIMING \ OUTPUT TIMING | $t_{vout}^+$ | $t_{vout}^-$ |
|---|---|---|
| $t_{vin}^+$ RISES BEFORE OR THE SAME, AND $t_{vin}^-$ RISES AFTER | DELAYED FROM $t_{vin}^+$ by DELAY TIME $\alpha$ | DELAYED FROM $t_{vin}^-$ by DELAY TIME $\alpha$ |
| $t_{vin}^+$ RISES AFTER, AND $t_{vin}^-$ RISES BEFORE | DELAYED FROM $t_{vin}^-$ by DELAY TIME $\alpha$ | |

SIGNAL PROCESSING CIRCUIT, SIGNAL PROCESSING DEVICE, AND SIGNAL PROCESSING METHOD TO SUPPRESS POWER CONSUMPTION

CROSS REFERENCE TO RELATED APPLICATIONS

This application is a U.S. National Phase of International Patent Application No. PCT/JP2019/027339 filed on Jul. 10, 2019, which claims priority benefit of Japanese Patent Application No. JP 2018-131664 filed in the Japan Patent Office on Jul. 11, 2018. Each of the above-referenced applications is hereby incorporated herein by reference in its entirety.

FIELD

The present disclosure relates to a signal processing circuit, a signal processing device, and a signal processing method.

BACKGROUND

Patent Literature 1 describes a multiply-accumulation operation device which expresses the information of an operation result by a temporal difference between two signals. The multiply-accumulation operation device according to Patent Literature 1 can be used for a neural network circuit. In a neural network circuit, a plurality of layers each including a plurality of multiply-accumulation operation circuits are connected in multiple layers. In addition, a signal processing circuit, which carries out various pieces of signal processing, is provided between one of the layers and another one of the layers. Examples of the various pieces of signal processing include activation function operation processing and maximum extracting (Max Pooling) processing.

The above described various pieces of signal processing is carried out in a digital signal processing circuit. Therefore, a time-digital (Time-to-Digital) converting circuit, which converts two signals representing information by a temporal difference to digital signals before the above described various pieces of signal processing is carried out, is required. This time-digital converting circuit corresponds to an analog-digital (A/D) converting circuit. Furthermore, a digital-time (Digital-to-Time) converting circuit, which converts digital signals to two signals representing information by a temporal difference after the above described various pieces of signal processing is carried out, is required. This digital-time converting circuit corresponds to a digital-analog (D/A) converting circuit.

CITATION LIST

Patent Literature

Patent Literature 1: WO 2018/034163 A

SUMMARY

Technical Problem

However, the time-digital converting circuit and the digital-time converting circuit have large power consumption.

Therefore, the present disclosure proposes a signal processing circuit, a signal processing device, and a signal processing method which can suppress power consumption.

Solution to Problem

According to the present disclosure, a signal processing circuit is provided that includes: a plurality of first circuits each including a first-time-length-signal output circuit configured to output a first time-length signal representing a time length between first timing at which a first input signal changes and second timing at which a second input signal changes and a second-time-length-signal output circuit configured to output the first time-length signal as a second time-length signal at timing based on a control signal; and a second circuit configured to output the second time-length signal having the longest time length among a plurality of the second time-length signals output respectively from the plurality of first circuits.

Moreover, according the present disclosure, a signal processing device is provided that includes: a plurality of multiply-accumulation operation circuits each configured to subject each of a plurality of signals to a first multiply-accumulation operation of subjecting the signal to multiplication by a first-group coefficient and then accumulation to output each of a plurality of first signals and configured to subject each of the plurality of signals to a second multiply-accumulation operation of subjecting the signal to multiplication by a second-group coefficient and then accumulation to output each of a plurality of second signals; and a signal processing circuit having a plurality of first circuits and a second circuit, the plurality of first circuits being electrically connected to the plurality of multiply-accumulation operation circuits, respectively, each of the first circuits including a first-time-length-signal output circuit configured to output a first time-length signal representing a time length between first timing at which the first signal changes and second timing at which the second signal changes and including a second-time-length-signal output circuit configured to output the first time-length signal as a second time-length signal at timing based on a control signal, the second circuit being configured to output the second time-length signal having the longest time length among a plurality of the second time-length signals output from the plurality of first circuits, respectively.

Advantageous Effects of Invention

According to the present disclosure, power consumption can be suppressed. The effects described herein are not necessarily limitative, and any of the effects described in the present disclosure may be exerted.

BRIEF DESCRIPTION OF DRAWINGS

FIG. 7 is a diagram illustrating relations between the input timing and the output timing of the activation function circuit of the neural network device according to the first embodiment of the present disclosure.

DESCRIPTION OF EMBODIMENTS

Hereinafter, embodiments of the present disclosure will be described in detail based on drawings. In the following embodiments, the same parts are denoted by the same reference signs to omit redundant descriptions.

First Embodiment

Figure 1:
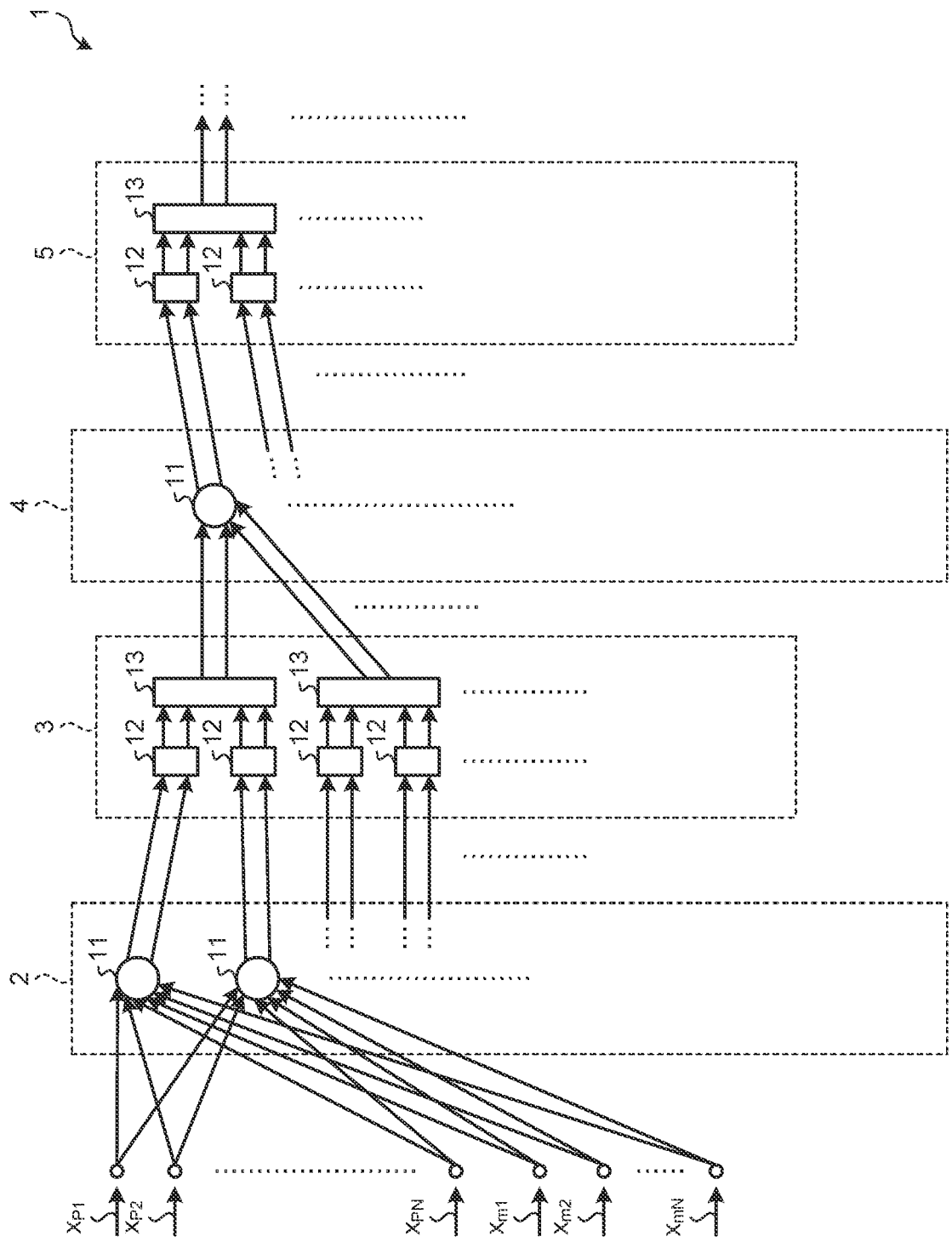
FIG. 1 is a diagram illustrating a configuration of a neural network device according to a first embodiment of the present disclosure.

[Configuration of Neural Network Device according to First Embodiment] FIG. 1 is a diagram illustrating a configuration of a neural network device according to a first embodiment of the present disclosure. A neural network device 1 includes a first layer circuit 2, a first interlayer circuit 3, a second layer circuit 4, and a second interlayer circuit 5.

The neural network device 1 is an example of a signal processing device of the present disclosure.

In the first embodiment, the neural network device 1 includes the two layers, i.e., the first layer circuit 2 and the second layer circuit 4. However, the present disclosure is not limited to this. The neural network device 1 may include three or more layers. The neural network device 1 may be formed on a semiconductor chip (die).

The first layer circuit 2 subjects a plurality of input signals $x_{pi}$, $x_{mi}$ (i is a natural number of 1 to N, N is a natural number of 2 or higher) to multiply-accumulation operation and outputs the signals representing operation results to the first interlayer circuit 3. The first interlayer circuit 3 subjects the output signals of the first layer circuit 2 to later-described processing and outputs the signals representing processing results to the second layer circuit 4. The second layer circuit 4 subjects the output signals of the first interlayer circuit 3 to multiply-accumulation operation and outputs the signals representing processing results to the second interlayer circuit 5. The second interlayer circuit 5 subjects the output signals of the second layer circuit 4 to later-described processing and outputs the signals representing processing results to a subsequent circuit.

The first layer circuit 2 includes a plurality of multiply-accumulation operation circuits 11. The first interlayer circuit 3 includes a plurality of activation function circuits 12 and a plurality of maximum extracting circuits 13. The second layer circuit 4 includes a plurality of multiply-accumulation operation circuits 11. The second interlayer circuit 5 includes a plurality of activation function circuits 12 and a plurality of maximum extracting circuits 13.

The maximum extracting circuit 13 is an example of a signal processing circuit of the present disclosure. The activation function circuit 12 is an example of a second signal processing circuit of the present disclosure. The multiply-accumulation operation circuit 11 is an example of a multiply-accumulation operation circuit of the present disclosure.

[Configuration and Working of Multiply-Accumulation Operation Circuit]

Figure 2:
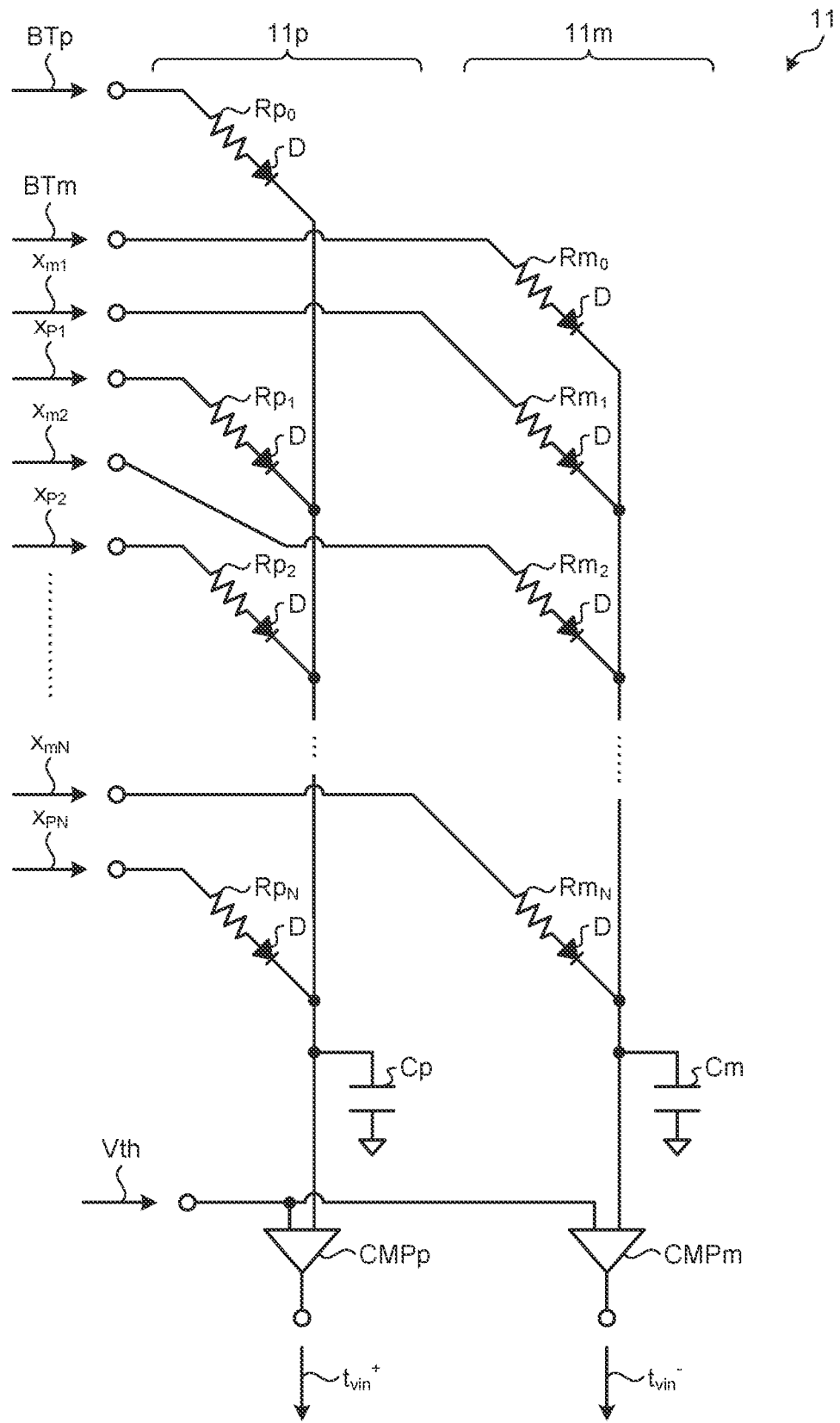
FIG. 2 is a diagram illustrating a configuration of a multiply-accumulation operation circuit of the neural network device according to the first embodiment of the present disclosure.

FIG. 2 is a diagram illustrating a configuration of the multiply-accumulation operation circuit of the neural network device according to the first embodiment of the present disclosure. The multiply-accumulation operation circuit 11 includes a first multiply-accumulation operation circuit 11p and a second multiply-accumulation operation circuit 11m.

The multiply-accumulation operation circuit 11 is a temporal-axis multiply-accumulation operation circuit which expresses the information of an operation result by the temporal difference between a positive absolute value signal $t_{vin}^{+}$, which is the output signal of the first multiply-accumulation operation circuit 11p, and a negative absolute value signal $t_{vin}^{-}$, which is the output signal of the second multiply-accumulation operation circuit 11m.

The first multiply-accumulation operation circuit 11p includes a capacitor Cp, which has one end electrically connected to a standard potential. The standard potential is exemplified by a ground potential, but the present disclosure is not limited thereto. The capacitor Cp may be another electricity storage element such as a gate capacity of a MOS transistor.

The first multiply-accumulation operation circuit 11p includes a resistor $Rp_0$. The first multiply-accumulation operation circuit 11p includes a diode D for preventing backflow, which has an anode electrically connected to one end of the resistor $Rp_0$ and has a cathode electrically connected to another end of the capacitor Cp. A bias voltage BTp is input to another end of the resistor $Rp_0$. Therefore, the current corresponding to the bias voltage BTp and the resistance value of the resistor $Rp_0$ is supplied to the capacitor Cp.

The first multiply-accumulation operation circuit 11p includes a plurality of resistors $Rp_i$ (i is a natural number of 1 to N, and N is a natural number of 2 or higher). The first multiply-accumulation operation circuit 11p includes a plurality of diodes D for preventing backflow, each of which has an anode electrically connected to one end of a resistor $Rp_i$ and has a cathode electrically connected to the other end of the capacitor Cp. The input signal $x_{pi}$ is input to another end of the resistor $Rp_i$. Therefore, the current corresponding to the voltage of the input signal $x_{pi}$ and the resistance value of the resistor $Rp_i$ is supplied to the capacitor Cp, and the voltage of the capacitor Cp increases. The input signal $x_{pi}$ may be a pulse-width modulation signal.

Therefore, the first multiply-accumulation operation circuit 11p carries out a multiply-accumulation operation of the following Expression (1). In Expression (1), $w_i$ is a weighting coefficient and is determined by the resistance value of the resistor $Rp_i$ (more specifically, the inverse number of the resistance value).

$$\sum_{i=1}^{N} w_i x_i \qquad (1)$$

The resistance value of the resistor $Rp_i$ may be switchable or may be changeable.

The first multiply-accumulation operation circuit 11p includes a comparator CMPp. If the voltage of the capacitor Cp is lower than a threshold voltage Vth, the comparator CMPp outputs a low-level signal $t_{vin}+$. If the voltage of the capacitor Cp is equal to or higher than the threshold voltage Vth, the comparator CMPp outputs a high-level signal $t_{vin}+$.

The larger the multiply-accumulation operation result, the faster the voltage of the capacitor Cp increases. Therefore, the timing at which the first multiply-accumulation operation circuit 11p outputs the high-level signal $t_{vin}^+$ becomes earlier. The smaller the multiply-accumulation operation result, the slower the voltage of the capacitor Cp increases. Therefore, the timing at which the first multiply-accumulation operation circuit 11p outputs the high-level signal $t_{vin}^+$ is delayed.

The second multiply-accumulation operation circuit 11m includes a capacitor Cm, which has one end electrically connected to the standard potential. The capacitor Cm may be another electricity storage element such as a gate capacity of a MOS transistor.

The second multiply-accumulation operation circuit 11m includes a resistor $Rm_0$. The second multiply-accumulation operation circuit 11m includes a diode D for preventing backflow, which has an anode electrically connected to one end of the resistor $Rm_0$ and has a cathode electrically connected to another end of the capacitor Cm. A bias voltage BTm is input to another end of the resistor $Rm_0$. Therefore, the current corresponding to the bias voltage BTm and the resistance value of the resistor $Rm_0$ is supplied to the capacitor Cm.

The second multiply-accumulation operation circuit 11m includes a plurality of resistors $Rm_i$ (i is a natural number of 1 to N, and N is a natural number of 2 or higher). The second multiply-accumulation operation circuit 11m includes a plurality of diodes D for preventing backflow, each of which has an anode electrically connected to one end of a resistor $Rm_i$ and has a cathode electrically connected to the other end of the capacitor Cm. The input signal $x_{mi}$ is input to another end of the resistor $Rm_i$. Therefore, the current corresponding to the voltage of the input signal $x_{mi}$ and the resistance value of the resistor $Rm_i$ is supplied to the capacitor Cm, and the voltage of the capacitor Cm increases.

Therefore, the second multiply-accumulation operation circuit 11m carries out a multiply-accumulation operation of above described Expression (1).

The resistance value of the resistor $Rm_i$ may be switchable or may be changeable.

The second multiply-accumulation operation circuit 11m includes a comparator CMPm. If the voltage of the capacitor Cm is lower than a threshold voltage Vth, the comparator CMPm outputs a low-level signal $t_{vin}^-$. If the voltage of the capacitor Cm is equal to or higher than the threshold voltage Vth, the comparator CMPm outputs a high-level signal $t_{vin}^-$.

The larger the multiply-accumulation operation result, the faster the voltage of the capacitor Cm increases. Therefore, the timing at which the second multiply-accumulation operation circuit 11m outputs the high-level signal $t_{vin}^-$ becomes earlier. The smaller the multiply-accumulation operation result, the slower the voltage of the capacitor Cm increases. Therefore, the timing at which the second multiply-accumulation operation circuit 11m outputs the high-level signal $t_{vin}^-$ is delayed.

The multiply-accumulation operation circuit 11 expresses the information of the operation result by the temporal difference between the signal $t_{vin}^+$ and the signal $t_{vin}^-$.

[Configuration and Working of Activation Function Circuit]

The activation function circuit 12 is a circuit which subjects the signals $t_{vin}+$ and $t_{vin}^-$, which are the output signals of the multiply-accumulation operation circuit 11, to a non-linear function operation. In the first embodiment, the non-linear function is a rectified linear unit (ReLU). The ReLU is expressed by the following Expression (2). The ReLU is sometimes also referred to as a ramp function.

$$\operatorname{Re}LU(x) = \begin{cases} x(x \geq 0) \\ 0(x < 0) \end{cases} \qquad (2)$$

Figure 3:
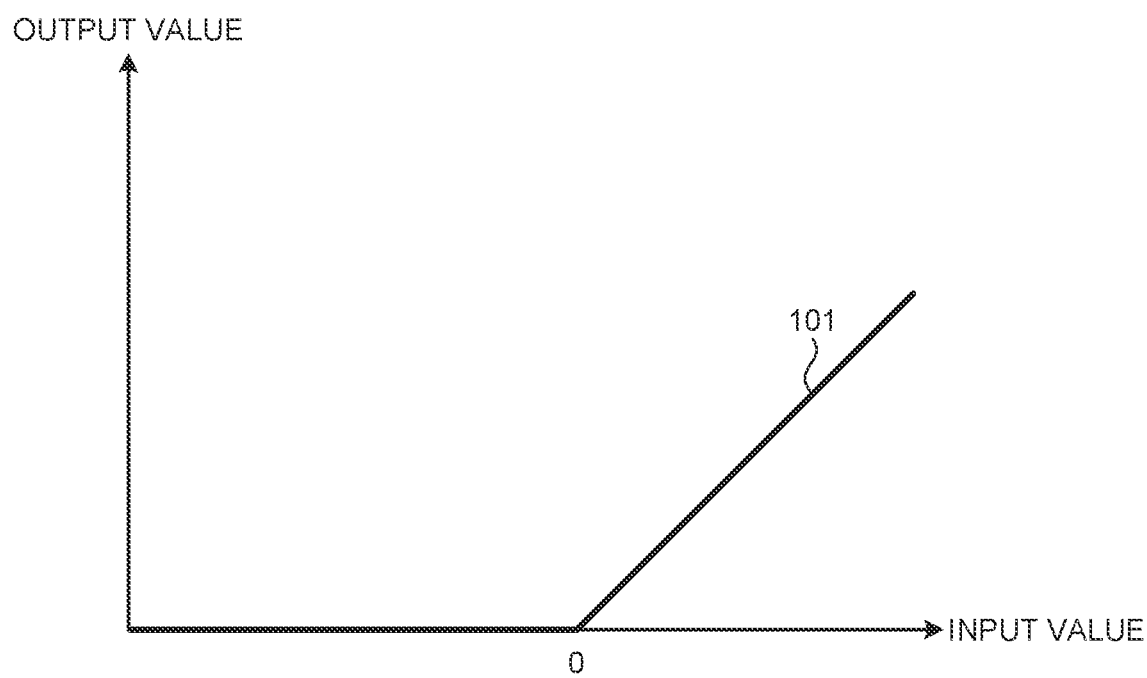
FIG. 3 is a diagram illustrating input-output characteristics of a ReLU.

FIG. 3 is a diagram illustrating input-output characteristics of the ReLU. As illustrated in a graph 101 of FIG. 3, if an input value is smaller than 0, an output value becomes 0. If the input value is equal to or higher than 0, the output value becomes the same as the input value.

Figure 4:
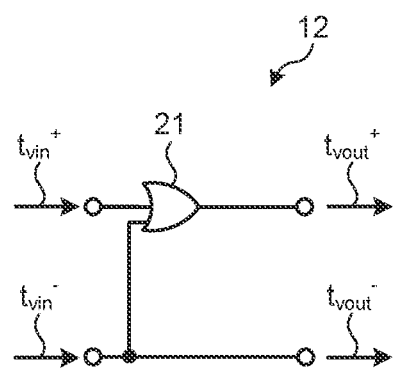
FIG. 4 is a diagram illustrating a configuration of an activation function circuit of the neural network device according to the first embodiment of the present disclosure.

FIG. 4 is a diagram illustrating a configuration of the activation function circuit of the neural network device according to the first embodiment of the present disclosure. The activation function circuit 12 includes a logic circuit.

Logic circuits are roughly categorized into combinational circuits and sequential circuits. The combinational circuit is a circuit in which a current output signal depends only on a current input signal, but does not depend on a past input signal. Examples of the combinational circuit include a logical addition circuit (OR gate circuit), a logical conjunction circuit (AND gate circuit), etc. The sequential circuit is a circuit in which a current output signal depends on a current input signal and a past input signal. Examples of the sequential circuit include a D-type flip-flop, an RS-type flip-flop, etc.

As illustrated in FIG. 4, the activation function circuit 12 includes a logical addition circuit (OR gate circuit) 21, which is a combinational circuit.

The logical addition circuit 21 subjects the signal $t_{vin}^+$ and the signal $t_{vin}^-$ to a logical addition operation and outputs a signal $t_{vout}^+$, which is the result of the logical addition operation.

The activation function circuit 12 outputs the signal $t_{vin}^-$ as a signal $t_{vout}^-$ without change.

Figure 5:
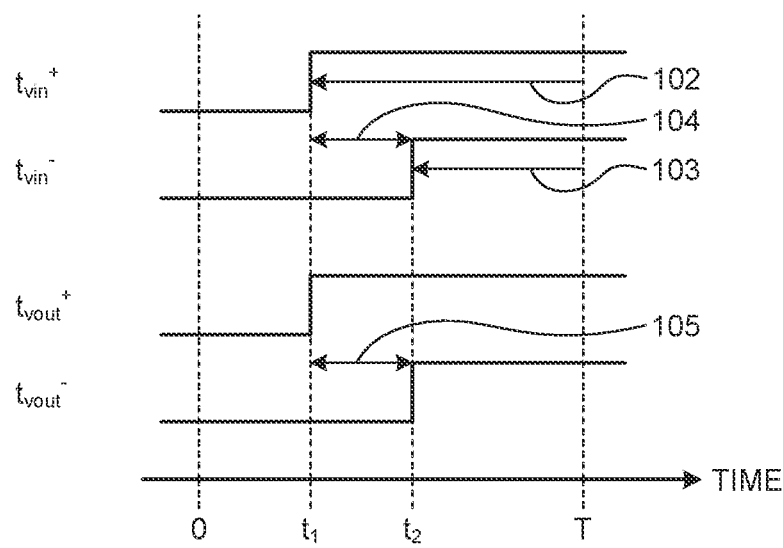
FIG. 5 is a timing diagram illustrating working timing of the activation function circuit of the neural network device according to the first embodiment of the present disclosure.

FIG. 5 is a timing diagram illustrating working timing of the activation function circuit of the neural network device according to the first embodiment of the present disclosure. More specifically, FIG. 5 is a diagram illustrating the working timing of the activation function circuit 12 in a case in which the rising timing of the signal $t_{vin}^+$ is earlier than the rising timing of the signal $t_{vin}^-$.

The signal $t_{vin}^+$ rises from a low level to a high level at timing $t_1$. Time 102 between the timing $t_1$ and timing T, which is determined in advance, corresponds to a positive absolute value, which is the operation result of the first multiply-accumulation operation circuit 11p (see FIG. 2).

The signal $t_{vin}^-$ rises from a low level to a high level at timing $t_2$, which is after the timing $t_1$. Time 103 between the timing $t_2$ and timing T, which is determined in advance, corresponds to a negative absolute value, which is the operation result of the second multiply-accumulation operation circuit 11m (see FIG. 2).

Then, the multiply-accumulation operation circuit 11 expresses the information of the result of the multiply-accumulation operation by a temporal difference 104 (positive temporal difference) between the timing $t_1$ and the timing $t_2$.

Since the signal $t_{vin}^+$ becomes the high level at the timing $t_1$, the logical addition circuit 21 outputs the high-level signal $t_{vout}^+$.

Since the signal $t_{vin}^-$ becomes the high level at the timing $t_2$, the activation function circuit 12 outputs the high-level signal $t_{vout}^-$.

Therefore, a temporal difference 105 between the signal $t_{vout}^+$ and the signal $t_{vout}^-$ is the same as the temporal difference 104 between the signal $t_{vin}^+$ and the signal $t_{vin}^-$.

Figure 6:
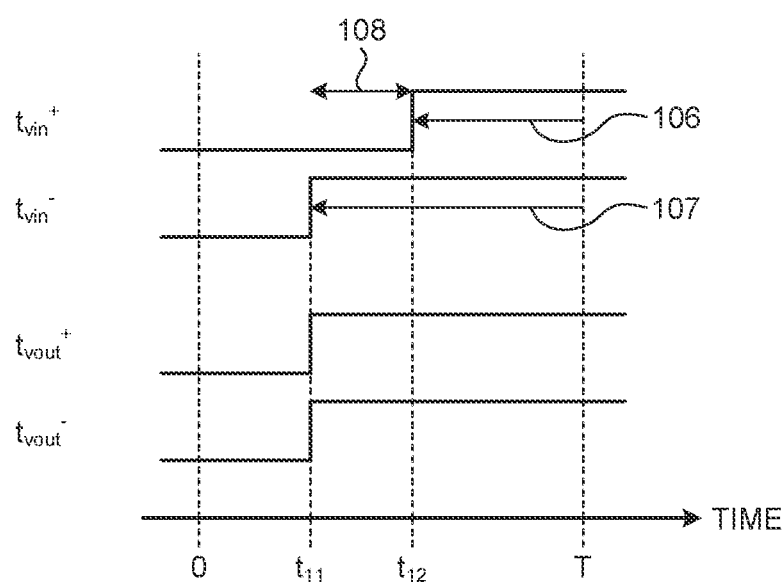
FIG. 6 is a timing diagram illustrating working timing of the activation function circuit of the neural network device according to the first embodiment of the present disclosure.

FIG. 6 is a timing diagram illustrating working timing of the activation function circuit of the neural network device according to the first embodiment of the present disclosure. More specifically, FIG. 6 is a diagram illustrating the working timing of the activation function circuit 12 in a case in which the rising timing of the signal $t_{vin}^+$ is after the rising timing of the signal $t_{vin}^-$.

The signal $t_{vin}^-$ rises from a low level to a high level at timing tn. Time 107 between the timing $t_{11}$ and the timing T, which is determined in advance, corresponds to the operation result of the second multiply-accumulation operation circuit 11m.

The signal $t_{vin}^+$ rises from a low level to a high level at timing $t_{12}$, which is after the timing tn. Time 106 between the timing $t_{12}$ and the timing T, which is determined in advance, corresponds to the operation result of the first multiply-accumulation operation circuit 11p.

Then, the multiply-accumulation operation circuit 11 expresses the information of the result of the multiply-accumulation operation by a temporal difference 108 (negative temporal difference) between the timing $t_{11}$ and the timing $t_{12}$.

Since the signal $t_{vin}^-$ becomes the high level at the timing $t_{11}$, the logical addition circuit 21 outputs the high-level signal $t_{vout}$+.

Since the signal $t_{vin}^-$ becomes the high level at the timing $t_{11}$, the activation function circuit 12 outputs the high-level signal $t_{vout}^-$.

Therefore, the signal $t_{vout}$+ and the signal $t_{vout}^-$ are output at the same timing.

FIG. 7 is a diagram illustrating relations between the input timing and the output timing of the activation function circuit of the neural network device according to the first embodiment of the present disclosure.

If the rising timing of the signal $t_{vin}^+$ is before or the same as the rising timing of the signal $t_{vin}^-$, the rising timing of the signal $t_{vout}^+$ is delayed from the rising timing of the signal $t_{vin}^+$ by delay time α. Herein, the delay time a is propagation delay time of the activation function circuit 12. The rising timing of the signal $t_{vout}^-$ is delayed from the rising timing of the signal $t_{vin}^-$ by the delay time α.

If the rising timing of the signal $t_{vin}^+$ is after the rising timing of the signal $t_{vin}^-$, the rising timing of the signal $t_{vout}^+$ is delayed from the rising timing of the signal $t_{vin}^-$ by the delay time α. Similarly, the rising timing of the signal $t_{vout}^-$ is delayed from the rising timing of the signal $t_{vin}^-$ by the delay time α.

As described above, the activation function circuit 12 can carry out the processing of the activation function without the need of a time-digital converting circuit. Moreover, the activation function circuit 12 can output the signals of the operation result of the activation function to the subsequent circuit without the need of a digital-time converting circuit. In this manner, the activation function circuit 12 can eliminate the need of the time-digital converting circuit and the digital-time converting circuit. Therefore, the activation function circuit 12 can suppress the power consumption corresponding to the amount consumed by the time-digital converting circuit and the digital-time converting circuit.

The activation function circuit 12 can eliminate the need of the time-digital converting circuit and the digital-time converting circuit. Therefore, the activation function circuit 12 can downsize the circuit of the neural network device 1 by the size corresponding to the time-digital converting circuit and the digital-time converting circuit.

The activation function circuit 12 can be realized by a combinational circuit (the logical addition circuit 21 in the first embodiment). Therefore, the activation function circuit 12 can downsize the circuit and also can suppress power consumption compared with a case in which non-linear function processing is realized by a digital signal processing circuit after time-digital conversion.

The activation function circuit 12 can suppress power consumption and downsize the circuit. Therefore, the activation function circuit 12 can further multiply the layers of the neural network device 1.

[Configuration and Working of Maximum Extracting Circuit]

The maximum extracting circuit 13 is a circuit which carries out Max Pooling processing, in which the larger ones among the output signals of the two activation function circuits 12 are extracted and output.

Figure 8:
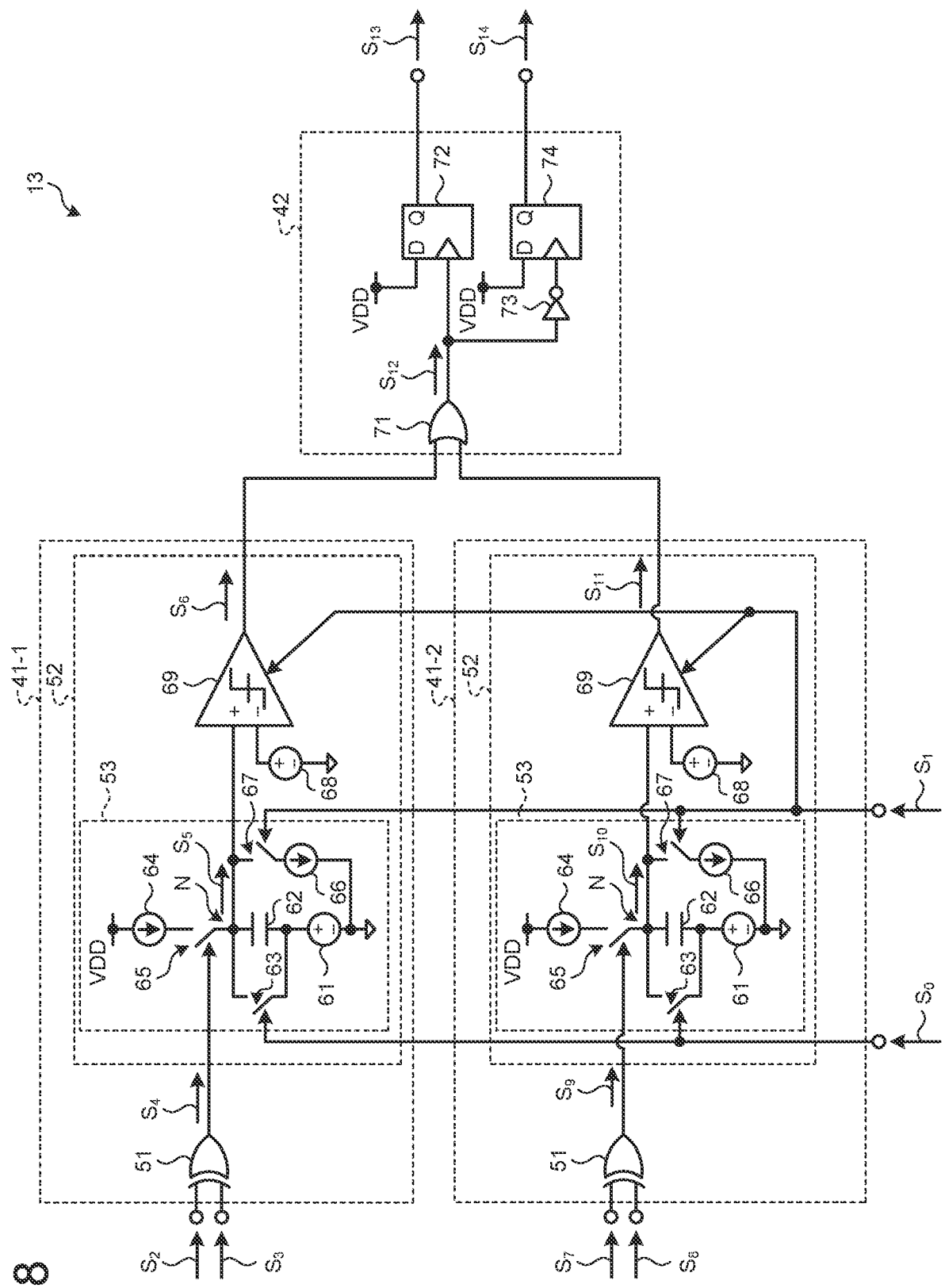
FIG. 8 is a diagram illustrating a configuration of a maximum extracting circuit of the neural network device according to the first embodiment of the present disclosure.

FIG. 8 is a diagram illustrating a configuration of the maximum extracting circuit of the neural network device according to the first embodiment of the present disclosure.

The maximum extracting circuit 13 includes two first circuits 41-1 and 41-2 and a second circuit 42.

The first circuits 41-1 and 41-2 are examples of a plurality of first circuits of the present disclosure. The second circuit 42 is an example of a second circuit of the present disclosure.

The first circuit 41-1, which is one of the circuits, includes a first-time-length-signal output circuit 51, which outputs a signal $S_4$, which is a first time-length signal representing the time length between first timing at which a signal $S_2$ serving as a first input signal changes and second timing at which a signal $S_3$ serving as a second input signal changes.

The first-time-length-signal output circuit 51 is an example of a first-time-length-signal output circuit of the present disclosure.

The first circuit 41-1 also includes a second-time-length-signal output circuit 52, which outputs the signal $S_4$ as a signal $S_6$, which is a second time-length signal, at the timing based on a signal $S_1$, which is an enable control signal.

The second-time-length-signal output circuit 52 is an example of a second-time-length-signal output circuit of the present disclosure.

The signals $S_2$ and $S_3$ are signals $t_{vout}^+$ and $t_{vout}^-$, which are the output signals of the single activation function circuit 12.

The first-time-length-signal output circuit 51 is an exclusive disjunction circuit (XOR gate circuit), which is a combinational circuit which subjects the signal $S_2$ and the signal $S_3$ to an exclusive disjunction operation.

The second-time-length-signal output circuit 52 includes a charge/discharge circuit 53, which charges a capacitor 62 with an electric charge based on the signal $S_4$ and discharges the capacitor 62 based on the signal $S_1$, which is the enable control signal.

The charge/discharge circuit 53 is an example of a charge/discharge circuit of the present disclosure. The capacitor 62 is an example of an electricity storage element of the present disclosure.

The charge/discharge circuit 53 includes a first constant voltage source 61, which outputs a reference potential Vref. The charge/discharge circuit 53 also includes the capacitor 62, which has one end electrically connected to the first constant voltage source 61 and has another end electrically connected to a node N.

The charge/discharge circuit 53 also includes a first constant current source 64, which has one end electrically connected to a power source potential VDD of a high potential side. The charge/discharge circuit 53 also includes a first switch 65, which has an input/output path connected between another end of the first constant current source 64 and the node N and includes a control terminal to which the signal $S_4$ is supplied.

The first constant current source 64 is an example of a first constant current source of the present disclosure. The first switch 65 is an example of a first switch of the present disclosure.

The charge/discharge circuit 53 also includes a second constant current source 66, which has one end connected to the standard potential. The charge/discharge circuit 53 also includes a second switch 67, which has an input/output path connected between the node N and another end of the second constant current source 66 and includes a control terminal to which the signal $S_1$ is supplied.

The second constant current source 66 is an example of a second constant current source of the present disclosure. The second switch 67 is an example of a second switch of the present disclosure.

The charge/discharge circuit 53 also includes a third switch 63, which has an input/output path connected to both ends of the capacitor 62 and includes a control terminal to which a signal $S_0$ serving as a reset signal is supplied.

The second-time-length-signal output circuit 52 includes a comparator 69, which has an inverting input terminal electrically connected to a second constant voltage source 68, which outputs the reference potential Vref, and has a non-inverting input terminal electrically connected to the node N.

The comparator 69 is an example of a comparison circuit of the present disclosure.

The comparator 69 compares a signal $S_5$ with the reference potential Vref and outputs a high-level signal $S_6$ during a period in which the signal $S_5$ is equal to or higher than the reference potential Vref.

The first circuit 41-2, which is the other one of the circuits, includes a first-time-length-signal output circuit 51, which outputs a signal $S_9$, which is a first time-length signal representing the time length between first timing at which a signal $S_7$ serving as a first input signal changes and second timing at which a signal $S_8$ serving as a second input signal changes.

The first circuit 41-2 also includes a second-time-length-signal output circuit 52, which outputs the signal $S_9$ as a signal $S_{11}$, which is a second time-length signal, at the timing based on the signal $S_1$.

The signals $S_7$ and $S_8$ are signals $t_{vout}^+$ and $t_{vout}^-$, which are the output signals of another activation function circuit 12.

Since the circuit configuration of the first circuit 41-2 is the same as the circuit configuration of the first circuit 41-1, the description thereof will be omitted.

The second circuit 42 includes a logical addition circuit (OR gate circuit) 71, which is a combinational circuit which subjects the signal $S_6$ and the signal $S_{11}$ to a logical addition operation.

The logical addition circuit 71 is an example of a second logic circuit of the present disclosure.

The second circuit 42 also includes a D-type first flip-flop 72, which is a sequential circuit which retains a high level (the power source potential VDD) and outputs a signal $S_{13}$ at a rising edge of a signal $S_{12}$, which is the output signal of the logical addition circuit 71.

The first flip-flop 72 is an example of a first sequential circuit of the present disclosure.

The second circuit 42 also includes an inverting circuit (NOT gate circuit) 73, which is a combinational circuit which inverts the signal $S_{12}$. The second circuit 42 also includes a D-type second flip-flop 74, which is a sequential circuit which retains the high level and outputs a signal $S_{14}$ at a rising edge of the output signal of the inverting circuit 73.

The second flip-flop 74 is an example of a second sequential circuit of the present disclosure.

In the first embodiment, the second circuit 42 extracts and outputs the larger one among the output signals of the two first circuits 41-1 and 41-2, but the present disclosure is not limited thereto. The second circuit 42 may extract and output the largest one among the output signals of three or more first circuits. For example, the logical addition circuit 71 may be a three-input logical addition circuit, and three first circuits may be electrically connected to the three inputs of the logical addition circuit 71.

Figure 9:
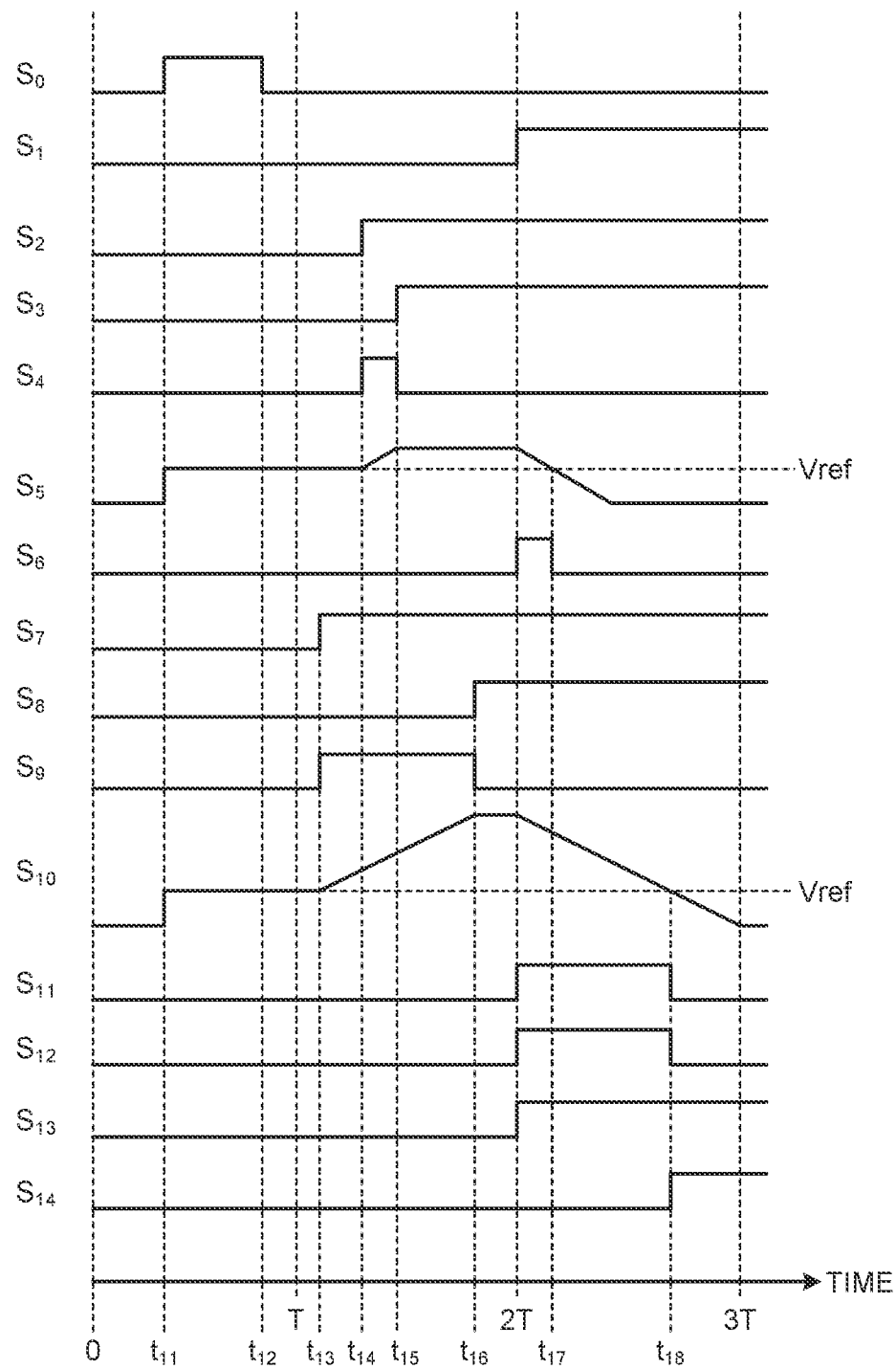
FIG. 9 is a timing diagram illustrating working timing of the maximum extracting circuit of the neural network device according to the first embodiment of the present disclosure.

FIG. 9 is a timing diagram illustrating working timing of the maximum extracting circuit of the neural network device according to the first embodiment of the present disclosure.

The period from timing 0 to timing T, which is determined in advance, is a reset period. The signal $S_0$, which is the reset signal, is the high level between the timing $t_{11}$ to the timing $t_{12}$.

When the signal $S_0$ becomes the high level at the timing $t_{11}$, the third switch 63 in the first circuit 41-1 becomes an on-state, and both the ends of the capacitor 62 are therefore short-circuited. Therefore, the signal $S_5$, which is the potential of the node N, becomes the reference potential Vref.

Similarly, the third switch 63 in the first circuit 41-2 becomes an on-state, and both the ends of the capacitor 62 are therefore short-circuited. Therefore, a signal $S_{10}$, which is the potential of the node N, becomes the reference potential Vref.

The period from the timing T to timing 2T, which is determined in advance, is a charge period.

At timing $t_{13}$, the signal $S_7$, which is the first input signal of the first circuit 41-2, becomes the high level. Since the signal $S_7$ becomes the high level, the first-time-length-signal output circuit 51, which is an exclusive disjunction circuit, outputs the high-level signal $S_9$. Since the signal $S_9$ becomes the high level, the first switch 65 becomes the on-state. Since the first switch 65 becomes the on-state, the first constant current source 64 charges the capacitor 62. Therefore, the signal $S_{10}$, which is the potential of the node N, increases linearly.

At timing $t_{14}$, the signal $S_2$, which is the first input signal of the first circuit 41-1, becomes the high level. Since the signal $S_2$ becomes the high level, the first-time-length-signal output circuit 51, which is an exclusive disjunction circuit, outputs the high-level signal $S_4$. Since the signal $S_4$ becomes the high level, the first switch 65 becomes the on-state. Since the first switch 65 becomes the on-state, the first constant current source 64 charges the capacitor 62. Therefore, the signal $S_5$, which is the potential of the node N, increases linearly.

At timing $t_{15}$, the signal $S_3$, which is the second input signal of the first circuit 41-1, becomes the high level. Since the signal $S_3$ becomes the high level, the first-time-length-signal output circuit 51, which is the exclusive disjunction circuit, outputs the low-level signal $S_4$. Since the signal $S_4$ becomes the low level, the first switch 65 becomes an off-state. Since the first switch 65 becomes the off-state, the capacitor 62 is not charged. Therefore, the signal $S_5$, which is the potential of the node N, stops increasing and becomes constant.

Herein, if the current value of the first constant current source 64 is represented by Icharge, the electrostatic capacity value of the capacitor 62 is represented by C, and the time length from the timing $t_{14}$ to the timing $t_{15}$ is represented by $\Delta$Tcharge, the voltage Vc of the capacitor 62 can be expressed by following Expression (3).

$$Vc=(Icharge/C)*\Delta Tcharge+Vref \quad (3)$$

At timing $t_{16}$, the signal $S_8$, which is the second input signal of the first circuit 41-2, becomes the high level. Since the signal $S_8$ becomes the high level, the first-time-length-signal output circuit 51, which is the exclusive disjunction circuit, outputs the low-level signal $S_9$. Since the signal $S_9$ becomes the low level, the first switch 65 becomes the off-state. Since the first switch 65 becomes the off-state, the capacitor 62 is not charged. Therefore, the signal $S_{10}$, which is the potential of the node N, stops increasing and becomes constant.

In this process, the voltage Vc of the capacitor 62 of the first circuit 41-2 can be expressed by the above described Expression (3).

The period from the timing 2T to timing 3T is an output period.

At the timing 2T, the signal $S_1$, which is the enable control signal, becomes the high level.

In the first circuit 41-1, since the signal $S_1$ becomes the high level, the second switch 67 becomes the on-state. Since the second switch 67 becomes the on-state, the second constant current source 66 discharges the capacitor 62. Therefore, the signal $S_5$, which is the potential of the node N, decreases linearly. At the timing 2T, the potential of the signal $S_5$ is higher than the reference potential Vref according to the above described Expression (3). Therefore, the comparator 69 outputs the high-level signal $S_6$.

Similarly, in the first circuit 41-2, since the signal $S_1$ becomes the high level, the second switch 67 becomes the on-state. Since the second switch 67 becomes the on-state, the second constant current source 66 discharges the capacitor 62. Therefore, the signal $S_{10}$, which is the potential of the node N, decreases linearly. At the timing 2T, the potential of the signal Sic is higher than the reference potential Vref according to the above described Expression (3). Therefore, the comparator 69 outputs the high-level signal $S_{11}$.

In the second circuit 42, since the signal $S_6$ and the signal $S_{11}$ become the high level, the logical addition circuit 71 outputs the high-level signal $S_{12}$. Since the signal $S_{12}$ becomes the high level, the first flip-flop 72 retains the high level, which is the potential determined in advance (in this case, the power source potential VDD), and outputs the high-level signal $S_{13}$.

At timing $t_{17}$, the signal $S_5$, which is the potential of the node N of the first circuit 41-1, becomes lower than the reference potential Vref. Therefore, the comparator 69 outputs the low-level signal $S_6$.

Herein, if the current value of the second constant current source 66 is represented by Idischarge, the time length $\Delta$Tdischarge from the timing 2T to the timing $t_{11}$ is expressed by the following expression (4).

$$\Delta Tdischarge=(Vc-Vref)/(Idischarge/C)=(Icharge/Idischarge)*\Delta Tcharge \quad (4)$$

Therefore, the time length $\Delta$Tdischarge is directly proportional to the time length $\Delta$Tcharge. In other words, discharge time is directly proportional to charge time.

If Idischarge=Icharge is satisfied, the charge/discharge circuit 53 can cause the time length $\Delta$Tdischarge to be equal to the time length $\Delta$Tcharge. In other words, the charge/discharge circuit 53 can cause the discharge time to be the same as the charge time.

If Idischarge <Icharge is satisfied, the charge/discharge circuit 53 can cause the time length $\Delta$Tdischarge to be longer than the time length $\Delta$Tcharge. In other words, the charge/discharge circuit 53 can cause the discharge time to be longer than the charge time. By virtue of this, the charge/discharge circuit 53 can also realize an amplifying function with respect to input time information.

At timing $t_{18}$, the signal $S_{10}$, which is the potential of the node N of the first circuit 41-2, becomes lower than the reference potential Vref. Therefore, the comparator 69 outputs the low-level signal $S_{11}$.

Herein, the time length $\Delta$Tdischarge from the timing 2T to the timing $t_{18}$ is expressed by the above described Expression (4).

In the second circuit 42, since the signal $S_6$ and the signal $S_{11}$ become the low level, the logical addition circuit 71 outputs the low-level signal $S_{12}$.

Since the timing of the rising edge of the signal $S_6$ and the timing of the rising edge of the signal $S_{11}$ are aligned, the logical addition circuit 71 can output the signal Sit, which has the same time length as the signal $S_{11}$, by the logical addition of the signal $S_6$ and the signal $S_{11}$.

Since the signal $S_{12}$ becomes the low level, the inverting circuit 73 outputs a high-level signal. The second flip-flop 74 retains the high level, which is the potential determined in advance (in this case, the power source potential VDD), and outputs the high-level signal $S_{14}$.

If the signal to a next layer may be a pulse signal (the signal $S_{12}$) instead of the differential signal (the signal $S_{13}$ and the signal $S_{14}$), the second circuit 42 can omit a first flip-flop 24, the inverting circuit 73, and a second flip-flop 25.

As described above, the maximum extracting circuit 13 extracts the signal $S_7$ and the signal $S_8$ which are the larger ones among the signal $S_2$ and the signal $S_3$, which are the output signals of one of the activation function circuits 12, and the signal $S_7$ and the signal $S_8$, which are the output signals of another activation function circuit 12. Then, the maximum extracting circuit 13 outputs the signal $S_{13}$ and the signal $S_{14}$, which have the same temporal difference as the temporal difference between the signal $S_7$ and the signal $S_8$ which have been extracted. By virtue of this, the maximum extracting circuit 13 can realize Max Pooling processing.

The maximum extracting circuit 13 can carry out the Max Pooling processing without the need of a time-digital converting circuit. Moreover, the maximum extracting circuit 13 can output the signal of the maximum extraction result to a subsequent circuit without the need of a digital-time converting circuit. In this manner, the maximum extracting circuit 13 can eliminate the need of the time-digital converting circuit and the digital-time converting circuit. Therefore, the maximum extracting circuit 13 can suppress the power consumption corresponding to the amount consumed by the time-digital converting circuit and the digital-time converting circuit.

Moreover, the maximum extracting circuit 13 can eliminate the need of the time-digital converting circuit and the digital-time converting circuit. Therefore, the maximum extracting circuit 13 can downsize the circuit of the neural network device 1 by the size corresponding to the time-digital converting circuit and the digital-time converting circuit.

Moreover, the maximum extracting circuit 13 can suppress power consumption and downsize the circuit. Therefore, the maximum extracting circuit 13 can further multiply the layers of the neural network device 1.

Moreover, if the maximum extracting circuit 13 is adjusted to satisfy Idischarge <Icharge, the time length ΔTdischarge can be caused to be longer than the time length ΔTcharge. In other words, the maximum extracting circuit 13 can cause the discharge time to be longer than the charge time. By virtue of this, the maximum extracting circuit 13 can also amplify the time information of input.

SUMMARY

As described above, the maximum extracting circuit 13 extracts the signal $S_7$ and the signal $S_8$ which are the larger ones among the signal $S_2$ and the signal $S_3$, which are the output signals of one of the activation function circuits 12, and the signal $S_7$ and the signal $S_8$, which are the output signals of another activation function circuit 12. Then, the maximum extracting circuit 13 outputs the signal $S_{13}$ and the signal $S_{14}$, which have the same temporal difference as the temporal difference between the signal $S_7$ and the signal $S_8$ which have been extracted. By virtue of this, the maximum extracting circuit 13 can realize Max Pooling processing.

The maximum extracting circuit 13 can carry out the Max Pooling processing without the need of a time-digital converting circuit. Moreover, the maximum extracting circuit 13 can output the signal of the maximum extraction result to a subsequent circuit without the need of a digital-time converting circuit. In this manner, the maximum extracting circuit 13 can eliminate the need of the time-digital converting circuit and the digital-time converting circuit. Therefore, the maximum extracting circuit 13 can suppress the power consumption corresponding to the amount consumed by the time-digital converting circuit and the digital-time converting circuit.

Moreover, the maximum extracting circuit 13 can eliminate the need of the time-digital converting circuit and the digital-time converting circuit. Therefore, the maximum extracting circuit 13 can downsize the circuit of the neural network device 1 by the size corresponding to the time-digital converting circuit and the digital-time converting circuit.

Moreover, the maximum extracting circuit 13 can suppress power consumption and downsize the circuit. Therefore, the maximum extracting circuit 13 can further multiply the layers of the neural network device 1.

Moreover, if the maximum extracting circuit 13 is adjusted to satisfy Idischarge <Icharge, the time length ΔTdischarge can be caused to be longer than the time length ΔTcharge. In other words, the maximum extracting circuit 13 can cause the discharge time to be longer than the charge time. By virtue of this, the maximum extracting circuit 13 can also amplify the time information of input.

Second Embodiment

Figure 10:
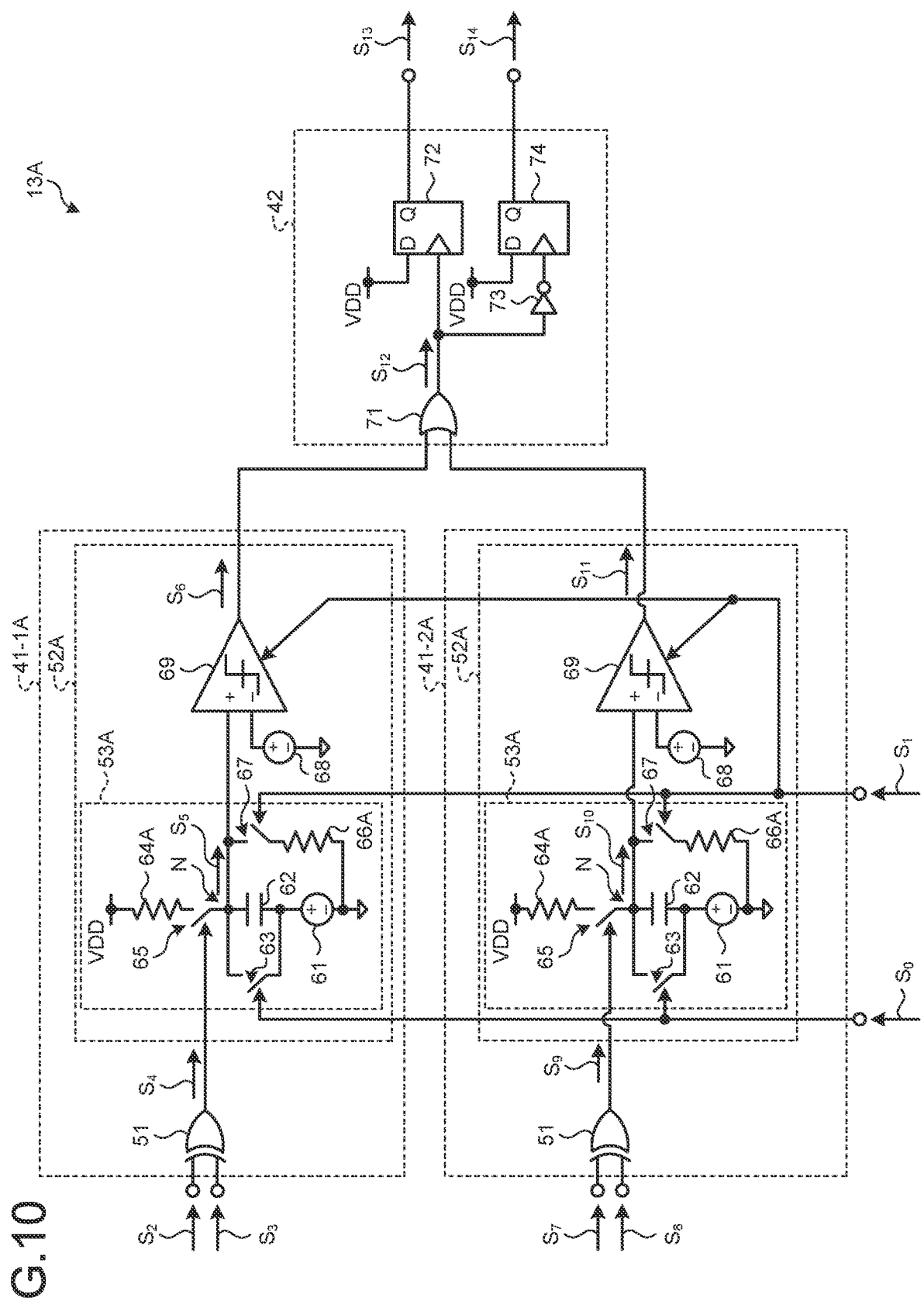
FIG. 10 is a diagram illustrating a configuration of a maximum extracting circuit of a second embodiment according to the present disclosure.

FIG. 10 is a diagram illustrating a configuration of a maximum extracting circuit of a second embodiment according to the present disclosure.

The maximum extracting circuit 13A includes first circuits 41-1A and 41-2A instead of the first circuits 41-1 and 41-2 compared with the maximum extracting circuit 13 (see FIG. 8) of the first embodiment.

The first circuit 41-1A includes a second-time-length-signal output circuit 52A instead of the second-time-length-signal output circuit 52 compared with the first circuit 41-1 (see FIG. 8).

The second-time-length-signal output circuit 52A includes a charge/discharge circuit 53A instead of the charge/discharge circuit 53 compared with the second-time-length-signal output circuit 52 (see FIG. 8).

The charge/discharge circuit 53A includes a resistor 64A instead of the first constant current source 64 compared with the charge/discharge circuit 53 (see FIG. 8). The charge/discharge circuit 53A includes a resistor 66A instead of the second constant current source 66 compared with the charge/discharge circuit 53.

Since the circuit configuration of the first circuit 41-2A is the same as the circuit configuration of the first circuit 41-1A, the description thereof will be omitted.

When the first switch 65 becomes the on-state, the capacitor 62 is charged from the power source potential VDD via the resistor 64A. When the second switch 67 becomes the on-state, the capacitor 62 is discharged via the resistor 66A.

The resistance value of the resistor 64A is represented by Rcharge, the resistance value of the resistor 66A is represented by Rdischarge, and the electrostatic capacity value of the capacitor 62 is represented by C. The time constant of an RC series circuit of the resistor 64A and the capacitor 62 is represented by (Rcharge*C). The time constant of an RC series circuit of the resistor 66A and the capacitor 62 is represented by (Rdischarge * C). If the charge time is sufficiently shorter than the time constant (Rcharge C) and the discharge time is sufficiently shorter than the time constant (Rdischarge C), the following Expression (5) and Expression (6) are satisfied as approximate expressions.

$$Vc \approx ((VDD/Rcharge)/C)*\Delta Tcharge + Vref \quad (5)$$

$$\Delta Tdischarge \approx (Vc-Vref)/(VDD/Rdischarge/C) = (Rdischarge/Rcharge)*\Delta Tcharge \quad (6)$$

In this manner, the maximum extracting circuit 13A can work similarly to the maximum extracting circuit 13.

Moreover, if the maximum extracting circuit 13A is adjusted to satisfy Rcharge <Rdischarge, the time length ΔTdischarge can be caused to be longer than the time length ΔTcharge. In other words, the maximum extracting circuit 13A can cause the discharge time to be longer than the charge time. By virtue of this, the maximum extracting circuit 13A can also amplify the time information of input.

Third Embodiment

Figure 11:
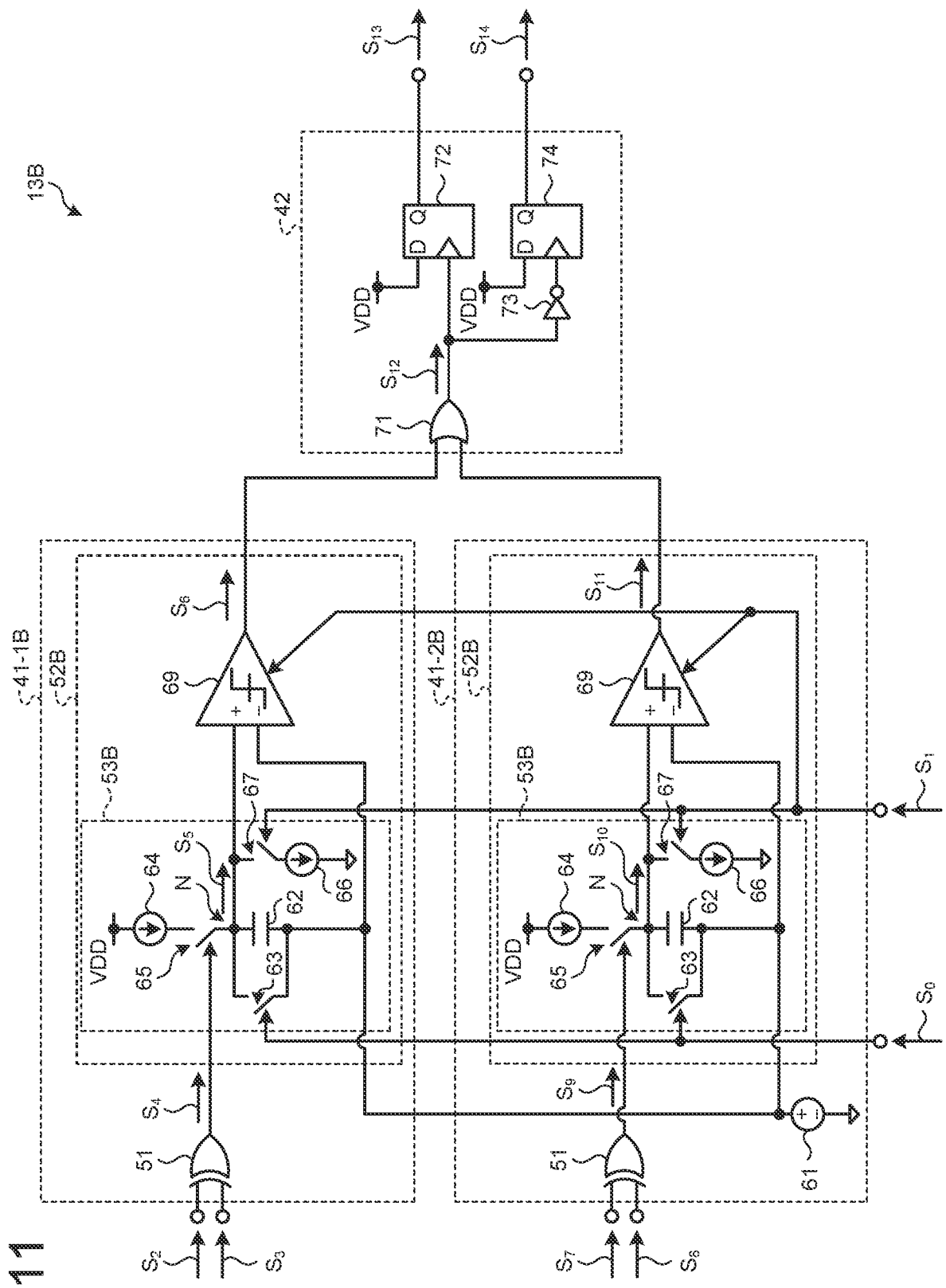
FIG. 11 is a diagram illustrating a configuration of a maximum extracting circuit of a third embodiment according to the present disclosure.

FIG. 11 is a diagram illustrating a configuration of a maximum extracting circuit of a third embodiment according to the present disclosure.

The maximum extracting circuit 13B includes first circuits 41-1B and 41-2B instead of the first circuits 41-1 and 41-2 compared with the maximum extracting circuit 13 (see FIG. 8) of the first embodiment.

The first circuit 41-1B includes a second-time-length-signal output circuit 52B instead of the second-time-length-signal output circuit 52 compared with the first circuit 41-1 (see FIG. 8).

The second-time-length-signal output circuit 52B includes a charge/discharge circuit 53B instead of the charge/discharge circuit 53 compared with the second-time-length-signal output circuit 52 (see FIG. 8).

The charge/discharge circuit 53B does not include the first constant voltage source 61 and the second constant voltage source 68 compared with the charge/discharge circuit 53 (see FIG. 8).

A single first constant voltage source 61 supplies the reference potential Vref to the one ends of the capacitors 62 of the charge/discharge circuits 53B and inverting terminals of the comparators 69 in both of the first circuit 41-1B and the first circuit 41-2B.

Therefore, the maximum extracting circuit 13B can reduce the number of the constant voltage sources compared with the maximum extracting circuit 13.

Fourth Embodiment

Figure 12:
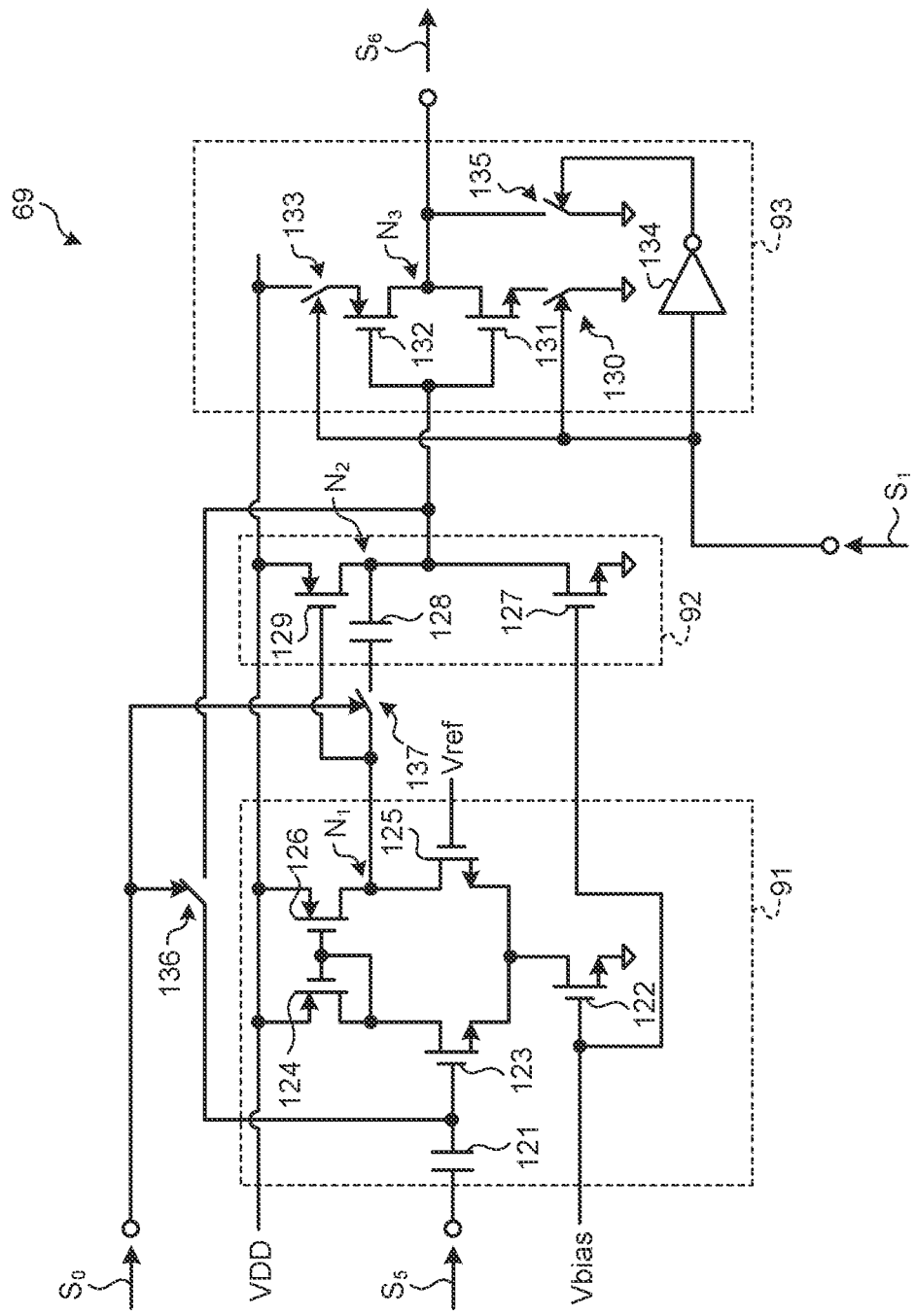
FIG. 12 is a diagram illustrating a configuration of a comparator of a maximum extracting circuit of a fourth embodiment of the present disclosure.

FIG. 12 is a diagram illustrating a configuration of a comparator of a maximum extracting circuit of a fourth embodiment of the present disclosure.

In the embodiments described above, if an error in the time length caused by an offset of the comparator 69 is allowable, the comparator 69 does not have to have an offset removing function. However, if the error in the time length caused by the offset of the comparator 69 is not allowable, it is preferred that the comparator 69 has an offset removing function as illustrated in FIG. 12.

The comparator 69 includes a first circuit 91, a second circuit 92, and a third circuit 93.

The first circuit 91, which is a differential pair circuit, includes a capacitor 121. The first circuit 91 also includes N-channel-type transistors 122, 123, and 125. Furthermore, the first circuit 91 includes P-channel-type transistors 124 and 126.

A source of the transistor 122 is connected to the standard potential. A bias potential Vbias determined in advance is input to a gate of the transistor 122. A drain of the transistor 122 is electrically connected to a source of the transistor 123 and a source of the transistor 125.

The signal $S_5$ is input to a gate of the transistor 123 via the capacitor 121, which is an input capacitor. A drain of the transistor 123 is electrically connected to a drain and a gate of the transistor 124.

A source of the transistor 124 is electrically connected to the power source potential VDD.

The reference potential Vref is input to the gate of the transistor 125. A drain of the transistor 125 is electrically connected to a node $N_1$.

A drain of the transistor 126 is electrically connected to the node $N_1$. A gate of the transistor 126 is electrically connected to the gate and the drain of the transistor 124. A source of the transistor 126 is electrically connected to the power source potential VDD.

The second circuit 92 includes an N-channel-type transistor 127, a P-channel-type transistor 129, and a capacitor 128.

A source of the transistor 127 is electrically connected to the standard potential. The bias potential Vbias is input to a gate of the transistor 127. A drain of the transistor 127 is electrically connected to a node $N_2$.

A drain of the transistor 129 is electrically connected to the node $N_2$. A gate of the transistor 129 is electrically connected to the node $N_1$. A source of the transistor 129 is electrically connected to the power source potential VDD.

One end of the capacitor 128 is electrically connected to the node $N_2$. Another end of the capacitor 128 is electrically connected to the node $N_1$ via a switch 137. The signal $S_0$, which is the reset signal, is input to a control terminal of the switch 137.

A switch 136 is electrically connected between the gate of the transistor 123 and the node $N_2$. The signal $S_0$, which is the reset signal, is input to a control terminal of the switch 136.

The third circuit 93 includes switches 130, 133, and 135, an N-channel-type transistor 131, a P-channel-type transistor 132, and an inverting circuit (inverter circuit) 134.

A source of the transistor 131 is electrically connected to the standard potential via the switch 130. The signal $S_1$, which is the enable control signal, is input to a control terminal of the switch 130. A gate of the transistor 131 is electrically connected to the node $N_2$. A drain of the transistor 131 is electrically connected to a node $N_3$.

A drain of the transistor 132 is connected to the node $N_3$. A gate of the transistor 132 is electrically connected to the node $N_2$. A source of the transistor 132 is electrically connected to the power source potential VDD via the switch 133. The signal $S_1$ is input to a control terminal of the switch 133.

The inverting circuit 134 inverts the signal $S_1$ and outputs the signal to a control terminal of the switch 135. The switch 135 is electrically connected between the node $N_3$ and the standard potential.

The third circuit 93 outputs the signal $S_6$ from the node $N_3$.

If the potential of the signal $S_5$ is lower than the reference potential Vref, the first circuit 91, which is the differential pair circuit, outputs a low-level signal from the node $N_1$. If the potential of the signal $S_5$ is equal to or higher than the reference potential Vref, the first circuit 91 outputs a high-level signal from the node $N_1$.

In the second circuit 92, if the low-level signal is input from the node $N_1$, the transistor 129 becomes an on-state and outputs a high-level signal from the node $N_2$. In the second circuit 92, if the high-level signal is input from the node $N_1$, the transistor 129 becomes an off-state and outputs a low-level signal from the node $N_2$.

In the third circuit 93, if the signal $S_1$, which is the enable control signal, is the high level and if the high-level signal is input from the node $N_2$, the transistor 131 becomes an on-state and outputs the low-level signal $S_6$ from the node $N_3$.

In the third circuit 93, if the signal $S_1$, which is the enable control signal, is the high level and if the low-level signal is input from the node $N_2$, the transistor 132 becomes an on-state and outputs the high-level signal $S_6$ from the node $N_3$.

If the signal $S_1$, which is the enable control signal, becomes the low level, the transistors 131 and 132 become an off-state, the switch 135 becomes an on-state, and the node $N_3$ becomes the standard potential. Therefore, the third circuit 93 outputs the low-level signal $S_6$ from the node $N_3$.

The comparator 69 also uses the signal $S_0$, which is the reset signal, as an offset-information acquisition signal. If the signal $S_0$, which is the reset signal, becomes the high level, the node $N_1$ and the node $N_2$ are electrically connected to each other via the capacitor 128, and the node $N_2$ and the gate of the transistor 123 are electrically connected to each other.

By virtue of this, the comparator 69 can once retain the electric charge, which represents offset information of the comparator 69, in the capacitor 121. Then, the comparator 69 carries out an action of comparing the signal $S_5$ with the reference potential Vref, thereby realizing an offset-free comparator function.

Fifth Embodiment

Figure 13:
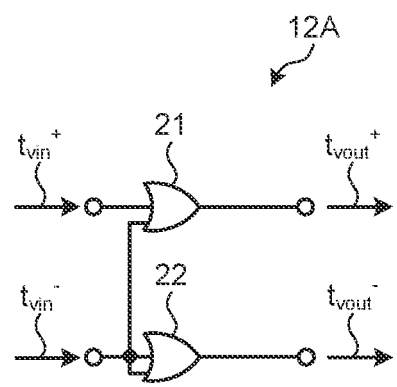
FIG. 13 is a diagram illustrating a configuration of an activation function circuit of a fifth embodiment of the present disclosure.

FIG. 13 is a diagram illustrating a configuration of an activation function circuit of a fifth embodiment of the present disclosure.

The activation function circuit 12A further includes a logical addition circuit (OR gate circuit) 22 compared with the activation function circuit 12 of the first embodiment (see FIG. 4).

The logical addition circuit 22 subjects the signal $t_{vin}^-$ and the signal $t_{vin}^-$ to a logical addition operation and outputs signals $t_{vout}^-$, which are results of the logical addition operation. The logical addition of the signal $t_{vin}^-$ and the signal $t_{vin}^-$ is the same as the signal $t_{vin}^-$.

In the activation function circuit 12A, the delay time of the signal $t_{vout}^+$ is the delay time of the logical addition circuit 21, and the delay time of the signal $t_{vout}^-$ is the delay time of the logical addition circuit 22. Herein, the delay time of the logical addition circuit 21 and the delay time of the logical addition circuit 22 is the same.

Therefore, the activation function circuit 12A can suppress the difference between the delay time of the signal $t_{vout}^+$ and the delay time of the signal $t_{vout}^-$.

The activation function circuit 12A may include another combinational circuit such as a buffer circuit instead of the logical addition circuit 22. However, from a viewpoint to suppress the difference with the delay time of the logical addition circuit 21, the activation function circuit 12A is preferred to include the logical addition circuit 22 which has the same delay time as the delay time of the logical addition circuit 21.

Sixth Embodiment

Figure 14:
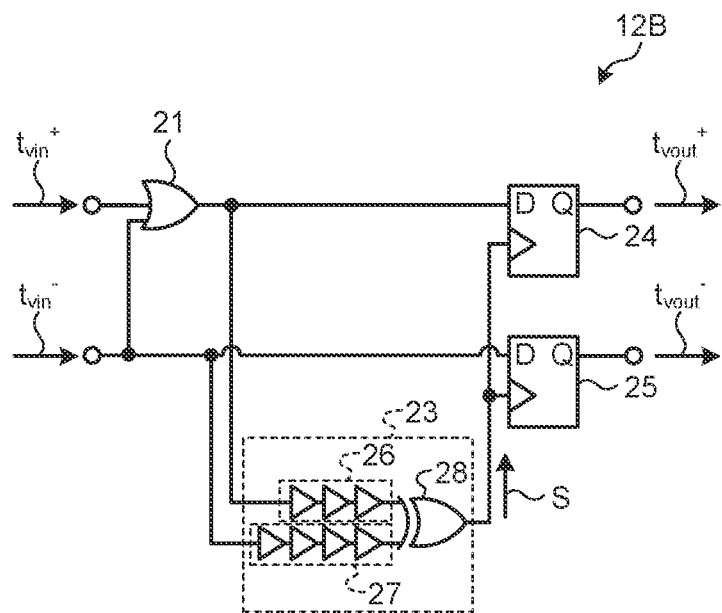
FIG. 14 is a diagram illustrating a configuration of an activation function circuit of a sixth embodiment of the present disclosure.

FIG. 14 is a diagram illustrating a configuration of an activation function circuit of a sixth embodiment of the present disclosure.

The activation function circuit 12B further includes a combinational circuit 23, a first flip-flop 24, and a second flip-flop 25 compared with the activation function circuit 12 of the first embodiment (see FIG. 4).

The combinational circuit 23 includes a first buffer circuit group 26 in which a plurality of buffer circuits (delay circuits) are connected in multiple stages, a second buffer circuit group 27 in which a plurality of buffer circuits (delay circuits) are connected in multiple stages, and an exclusive disjunction circuit 28.

The first buffer circuit group 26 delays the output signal of the logical addition circuit 21 and outputs the signal to one of input terminals of the exclusive disjunction circuit 28. The second buffer circuit group 27 delays the signal $t_{vin}^-$ and outputs the signal to the other input terminal of the exclusive disjunction circuit 28.

The D-type first flip-flop 24 retains the output signal of the logical addition circuit 21 and outputs the signal $t_{vout}^+$ at a rising edge and a decaying edge of an output signal S of the combinational circuit 23.

The D-type second flip-flop 25 retains the signal $t_{vin}^-$ and outputs the signal $t_{vout}^-$ at the rising edge and the decaying edge of an output signal S of the combinational circuit 23.

The combinational circuit 23 includes the first buffer circuit group 26 and the second buffer circuit group 27 in order to ensure the setup time of the first flip-flop 24 and the second flip-flop 25.

The first buffer circuit group 26 delays the output signal of the logical addition circuit 21, and the second buffer circuit group 27 delays the signal $t_{vin}^-$. Therefore, the output signal S of the exclusive disjunction circuit 28 is input to the first flip-flop 24 and the second flip-flop 25 at timing after the output signal of the logical addition circuit 21 and the signal $t_{vin}^-$.

By virtue of this, since setup time is ensured for the first flip-flop 24, the output signal of the logical addition circuit 21 can be reliably retained. Similarly, since setup time is ensured for the second flip-flop 25, the signal $t_{vin}^-$ can be reliably retained.

While the signal $t_{vin}^+$ passes through the logical addition circuit 21 and is input to the first flip-flop 24, the signal $t_{vin}^-$ is input to the second flip-flop 25 without passing through any logic circuit. Therefore, the number of the buffer circuits of the second buffer circuit group 27 is preferred to be larger than the number of the buffer circuits of the first buffer circuit group 26. As an illustrated example, the first buffer circuit group 26 includes three buffer circuits, and the second buffer circuit group 27 includes four buffer circuits.

In the activation function circuit 12B, the first flip-flop 24 retains the output signal of the logical addition circuit 21 and outputs the signal $t_{vout}^+$. The second flip-flop 25 retains the signal $t_{vin}^-$ and outputs the signal $t_{vout}^-$ Therefore, after the first flip-flop 24 retains the output signal of the logical addition circuit 21 and the second flip-flop 25 retains the signal $t_{vin}^-$, the previous multiply-accumulation operation circuit 11 (see FIG. 2) may stop outputting the signal $t_{vin}^+$ and the signal $t_{vin}^-$. By virtue of this, the previous multiply-accumulation operation circuit 11 can start a next multiply-accumulation operation.

By virtue of this, the activation function circuit 12B can realize speed-up of neural operations.

Seventh Embodiment

Figure 15:
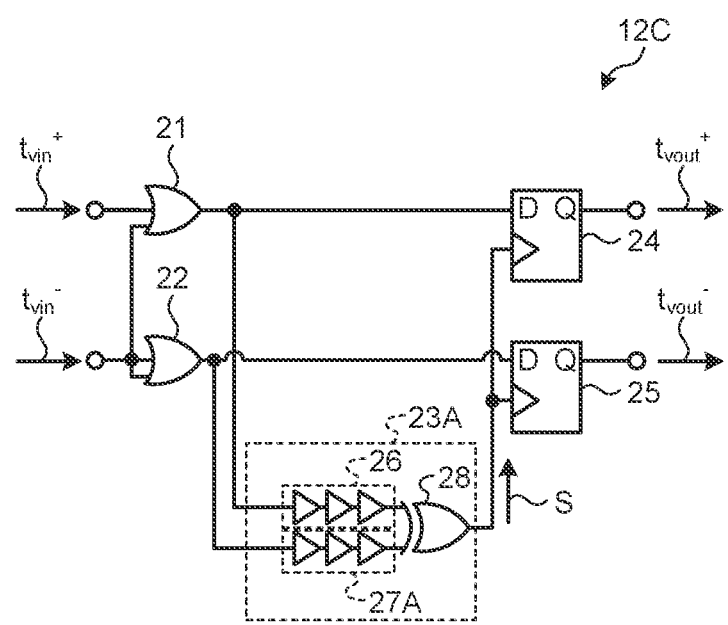
FIG. 15 is a diagram illustrating a configuration of an activation function circuit of a seventh embodiment of the present disclosure.

FIG. 15 is a diagram illustrating a configuration of an activation function circuit of a seventh embodiment of the present disclosure.

The activation function circuit 12C further includes the logical addition circuit 22 (see FIG. 13 of the fifth embodiment) compared with the activation function circuit 12B of the sixth embodiment (see FIG. 14). The activation function circuit 12C includes a combinational circuit 23A instead of the combinational circuit 23 compared with the activation function circuit 12B of the third embodiment.

The combinational circuit 23A includes a second buffer circuit group 27A instead of the second buffer circuit group 27 compared with the combinational circuit 23 of the sixth embodiment (see FIG. 14).

In the activation function circuit 12C, the signal $t_{vin}^{+}$ passes through the logical addition circuit 21 and is input to the first flip-flop 24, and the signal $t_{vin}^{-}$ passes through the logical addition circuit 22 and is input to the second flip-flop 25.

Therefore, the number of the buffer circuits of the second buffer circuit group 27A is preferred to be the same as the number of the buffer circuits of the first buffer circuit group 26. As an illustrated example, the first buffer circuit group 26 includes three buffer circuits, and the second buffer circuit group 27A includes three buffer circuits.

The activation function circuit 12C can work similarly to the activation function circuit 12B.

In the seventh embodiment, the combinational circuit 23A includes the first buffer circuit group 26 and the second buffer circuit group 27A in the input terminal side of the exclusive disjunction circuit 28. However, the present disclosure is not limited thereto. The combinational circuit 23A may include one buffer circuit group in the output terminal side of the exclusive disjunction circuit 28 instead of the first buffer circuit group 26 and the second buffer circuit group 27A. In this manner, the number of the buffer circuits can be suppressed.

The effects described in the present description are merely examples and are not limitative, and other effects may be included.

The present techniques can also employ the following configurations.

(1)
A signal processing circuit comprising:
   a plurality of first circuits each including a first-time-length-signal output circuit configured to output a first time-length signal representing a time length between first timing at which a first input signal changes and second timing at which a second input signal changes and a second-time-length-signal output circuit configured to output the first time-length signal as a second time-length signal at timing based on a control signal; and
   a second circuit configured to output the second time-length signal having the longest time length among a plurality of the second time-length signals output respectively from the plurality of first circuits.

(2)
The signal processing circuit according to (1), wherein the first-time-length-signal output circuit is a first logic circuit configured to subject the first input signal and the second input signal to a logic operation.

(3)
The signal processing circuit according to (2), wherein the first logic circuit is an exclusive disjunction circuit.

(4)
The signal processing circuit according to any one of (1) to (3), wherein
   the second-time-length-signal output circuit has
   a charge/discharge circuit configured to charge an electricity storage element with electric charge based on the first time-length signal and discharges the electricity storage element based on the control signal and
   a comparison circuit configured to compare a potential of the electricity storage element with a reference potential and output the second time-length signal in a period in which the potential of the electricity storage element is equal to or higher than the reference potential.

(5)
The signal processing circuit according to (4), wherein the charge/discharge circuit has
   a capacitor serving as the electricity storage element having one end electrically connected to the reference potential,
   a first constant current source having one end electrically connected to a first power source potential,
   a first switch having an input/output path electrically connected between another end of the first constant current source and another end of the capacitor and having a control terminal to which the first time-length signal is supplied,
   a second constant current source having one end electrically connected to a second power source potential, and
   a second switch having an input/output path electrically connected between the other end of the capacitor and another end of the second constant current source and having a control terminal to which the control signal is supplied.

(6)
The signal processing circuit according to (4), wherein the charge/discharge circuit has
   a capacitor serving as the electricity storage element having one end electrically connected to the reference potential,
   a first resistor having one end electrically connected to a first power source potential,
   a first switch having an input/output path electrically connected between another end of the first resistor and another end of the capacitor and having a control terminal to which the first time-length signal is supplied,
   a second resistor having one end electrically connected to a second power source potential, and
   a second switch having an input/output path electrically connected between the other end of the capacitor and another end of the second resistor and having a control terminal to which the control signal is supplied.

(7)
The signal processing circuit according to any one of (1) to (6), wherein
   the second circuit has a second logic circuit configured to subject the plurality of second time-length signals output respectively from the plurality of first circuits to a logic operation.

(8)
The signal processing circuit according to (7), wherein the second logic circuit is a logical addition circuit.

(9)
The signal processing circuit according to (7) or (8), wherein
   the second circuit further has a first sequential circuit configured to retain and output a potential determined in advance at a rising edge of an output signal of the second logic circuit, and a second sequential circuit configured to retain and output the potential determined in advance at a decaying edge of the output signal of the second logic circuit.

(10)
The signal processing circuit according to (9), wherein each of the first sequential circuit and the second sequential circuit is a flip-flop.

(11)

The signal processing circuit according to any one of (4) to (10), wherein
the reference potential is supplied from a single constant voltage source to the plurality of first circuits.

(12)

The signal processing circuit according to any one of (4) to (11), wherein
the comparison circuit acquires offset information while the second time-length signal is not output and outputs the second time-length signal based on the offset information.

(13)

A signal processing device comprising:
a plurality of multiply-accumulation operation circuits each configured to subject each of a plurality of signals to a first multiply-accumulation operation of subjecting the signal to multiplication by a first-group coefficient and then accumulation to output each of a plurality of first signals and configured to subject each of the plurality of signals to a second multiply-accumulation operation of subjecting the signal to multiplication by a second-group coefficient and then accumulation to output each of a plurality of second signals; and
a signal processing circuit having a plurality of first circuits and a second circuit, the plurality of first circuits being electrically connected to the plurality of multiply-accumulation operation circuits, respectively, each of the first circuits including a first-time-length-signal output circuit configured to output a first time-length signal representing a time length between first timing at which the first signal changes and second timing at which the second signal changes and including a second-time-length-signal output circuit configured to output the first time-length signal as a second time-length signal at timing based on a control signal, the second circuit being configured to output the second time-length signal having the longest time length among a plurality of the second time-length signals output from the plurality of first circuits, respectively.

(14)

The signal processing device according to (13), further comprising
a second signal processing circuit electrically connected between the multiply-accumulation operation circuit and the signal processing circuit and configured to subject the first signal and the second signal to a non-linear function operation and output signals to the signal processing circuit.

(15)

A signal processing method comprising:
outputting a first time-length signal representing a time length between first timing at which a first input signal changes and second timing at which a second input signal changes;
outputting the first time-length signal as a second time-length signal at timing based on a control signal; and
outputting the second time-length signal having the longest time length among a plurality of the second time-length signals.

REFERENCE SIGNS LIST

1 NEURAL NETWORK DEVICE
2 FIRST LAYER CIRCUIT
3 FIRST INTERLAYER CIRCUIT
4 SECOND LAYER CIRCUIT
5 SECOND INTERLAYER CIRCUIT
11 MULTIPLY-ACCUMULATION OPERATION CIRCUIT
11p FIRST MULTIPLY-ACCUMULATION OPERATION CIRCUIT
11m SECOND MULTIPLY-ACCUMULATION OPERATION CIRCUIT
12 ACTIVATION FUNCTION CIRCUIT
12A ACTIVATION FUNCTION CIRCUIT
12B ACTIVATION FUNCTION CIRCUIT
12C ACTIVATION FUNCTION CIRCUIT
13 MAXIMUM EXTRACTING CIRCUIT
13A MAXIMUM EXTRACTING CIRCUIT
13B MAXIMUM EXTRACTING CIRCUIT
21 LOGICAL ADDITION CIRCUIT
22 LOGICAL ADDITION CIRCUIT
23 COMBINATIONAL CIRCUIT
23A COMBINATIONAL CIRCUIT
24 FIRST FLIP-FLOP
25 SECOND FLIP-FLOP
26 FIRST BUFFER CIRCUIT GROUP
27 SECOND BUFFER CIRCUIT GROUP
27A SECOND BUFFER CIRCUIT GROUP
28 EXCLUSIVE DISJUNCTION CIRCUIT
41-1 FIRST CIRCUIT
41-1A FIRST CIRCUIT
41-1B FIRST CIRCUIT
41-2 FIRST CIRCUIT
41-2A FIRST CIRCUIT
41-2B FIRST CIRCUIT
42 SECOND CIRCUIT
51 FIRST-TIME-LENGTH-SIGNAL OUTPUT CIRCUIT
52 SECOND-TIME-LENGTH-SIGNAL OUTPUT CIRCUIT
52A SECOND-TIME-LENGTH-SIGNAL OUTPUT CIRCUIT
52B SECOND-TIME-LENGTH-SIGNAL OUTPUT CIRCUIT
53 CHARGE/DISCHARGE CIRCUIT
53A CHARGE/DISCHARGE CIRCUIT
53B CHARGE/DISCHARGE CIRCUIT
69 COMPARATOR
91 FIRST CIRCUIT
92 SECOND CIRCUIT
93 THIRD CIRCUIT

The invention claimed is:

1. A signal processing circuit, comprising:
a plurality of first circuits each including a first time-length signal output circuit and a second time-length signal output circuit, wherein
the first time-length signal output circuit is configured to output a first time-length signal representing a time length between first timing at which a first input signal changes and second timing at which a second input signal changes, and
the second time-length signal output circuit is configured to output the first time-length signal as a second time-length signal at timing based on a control signal; and
a second circuit configured to output the second time-length signal having the longest time length among a plurality of second time-length signals output respectively from the plurality of first circuits.

2. The signal processing circuit according to claim 1, wherein
the first time-length signal output circuit is a first logic circuit configured to subject the first input signal and the second input signal to a logic operation.

3. The signal processing circuit according to claim 2, wherein the first logic circuit is an exclusive disjunction circuit.

4. The signal processing circuit according to claim 1, wherein
the second time-length signal output circuit has a charge/discharge circuit configured to:
charge an electricity storage element with electric charge based on the first time-length signal; and
discharge the electricity storage element based on the control signal, and
a comparison circuit configured to:
compare a potential of the electricity storage element with a reference potential; and
output the second time-length signal in a period in which the potential of the electricity storage element is equal to or higher than the reference potential.

5. The signal processing circuit according to claim 4, wherein
the charge/discharge circuit has a capacitor serving as the electricity storage element having a first end electrically connected to the reference potential,
a first constant current source having a first end electrically connected to a first power source potential,
a first switch having an input/output path electrically connected between a second end of the first constant current source and a second end of the capacitor and having a control terminal to which the first time-length signal is supplied,
a second constant current source having a first end electrically connected to a second power source potential, and
a second switch having an input/output path electrically connected between the second end of the capacitor and a second end of the second constant current source and having a control terminal to which the control signal is supplied.

6. The signal processing circuit according to claim 4, wherein
the charge/discharge circuit has a capacitor serving as the electricity storage element having a first end electrically connected to the reference potential,
a first resistor having a first end electrically connected to a first power source potential,
a first switch having an input/output path electrically connected between a second end of the first resistor and a second end of the capacitor and having a control terminal to which the first time-length signal is supplied,
a second resistor having a first end electrically connected to a second power source potential, and
a second switch having an input/output path electrically connected between the second end of the capacitor and a second end of the second resistor and having a control terminal to which the control signal is supplied.

7. The signal processing circuit according to claim 1, wherein
the second circuit has a second logic circuit configured to subject the plurality of second time-length signals output respectively from the plurality of first circuits to a logic operation.

8. The signal processing circuit according to claim 7, wherein the second logic circuit is a logical addition circuit.

9. The signal processing circuit according to claim 7, wherein the second circuit further includes:
a first sequential circuit configured to retain and output a potential determined in advance at a rising edge of an output signal of the second logic circuit, and
a second sequential circuit configured to retain and output the potential determined in advance at a decaying edge of the output signal of the second logic circuit.

10. The signal processing circuit according to claim 9, wherein each of the first sequential circuit and the second sequential circuit is a flip-flop.

11. The signal processing circuit according to claim 4, wherein the reference potential is supplied from a single constant voltage source to the plurality of first circuits.

12. The signal processing circuit according to claim 4, wherein
the comparison circuit is further configured to:
acquire offset information based on null output of the second time-length signal; and
output the second time-length signal based on the offset information.

13. A signal processing device, comprising:
a plurality of multiply-accumulation operation circuits each configured to:
subject each of a plurality of signals to a first multiply-accumulation operation to subject each of the plurality of signals to multiplication by a first-group coefficient and then accumulation to output each of a plurality of first signals; and
subject each of the plurality of signals to a second multiply-accumulation operation to subject each of the plurality of signals to multiplication by a second-group coefficient and then accumulation to output each of a plurality of second signals; and
a signal processing circuit having a plurality of first circuits and a second circuit, wherein
the plurality of first circuits is electrically connected to the plurality of multiply-accumulation operation circuits, respectively,
each of the plurality of first circuits includes:
a first-time-length-signal output circuit configured to output a first time-length signal representing a time length between first timing at which a first signal of the plurality of first signals changes and second timing at which a second signal of the plurality of second signals changes; and
a second-time-length-signal output circuit configured to output the first time-length signal as a second time-length signal at timing based on a control signal,
the second circuit is configured to output the second time-length signal having the longest time length among a plurality of second time-length signals output from the plurality of first circuits, respectively.

14. The signal processing device according to claim 13, further comprising
a second signal processing circuit electrically connected between a multiply-accumulation operation circuit of the plurality of multiply-accumulation operation circuits and the signal processing circuit, wherein the second signal processing circuit is configured to:

subject the first signal and the second signal to a non-linear function operation; and output the first signal and the second signal to the signal processing circuit.

15. A signal processing method, comprising:

outputting, by a first time-length signal output circuit of a plurality of first circuits, a first time-length signal representing a time length between first timing at which a first input signal changes and second timing at which a second input signal changes;

outputting, by a second time-length signal output circuit of the plurality of first circuits, the first time-length signal as a second time-length signal at timing based on a control signal; and outputting, by a second circuit, the second time-length signal having the longest time length among a plurality of second time-length signals output respectively from the plurality of first circuits.

* * * * *